(12) United States Patent
Abedrabbo et al.

(10) Patent No.: US 8,748,908 B2
(45) Date of Patent: Jun. 10, 2014

(54) SEMICONDUCTOR OPTICAL EMISSION DEVICE

(76) Inventors: Sufian Abedrabbo, Kenilworth, NJ (US); Anthony Thomas Fiory, Summit, NJ (US)

( * ) Notice: Subject to any disclaimer, the term of this patent is extended or adjusted under 35 U.S.C. 154(b) by 0 days.

(21) Appl. No.: 13/465,089

(22) Filed: May 7, 2012

(65) Prior Publication Data

US 2013/0292707 A1 Nov. 7, 2013

(51) Int. Cl.
*H01L 33/00* (2010.01)

(52) U.S. Cl.
USPC .......... 257/86; 257/87; 257/E33.015; 438/22; 438/38

(58) Field of Classification Search
USPC ......... 257/87, 86, E35.015, E33.001; 438/22, 438/38
See application file for complete search history.

(56) References Cited

U.S. PATENT DOCUMENTS

| | | | |
|---|---|---|---|
| 4,529,455 A | 7/1985 | Bean et al. | |
| 4,652,467 A | 3/1987 | Brinker et al. | |
| 4,684,964 A | 8/1987 | Pancove et al. | |
| 5,012,304 A | 4/1991 | Kash et al. | |
| 5,206,523 A | 4/1993 | Goesele et al. | |
| 5,324,965 A | 6/1994 | Tompsett et al. | |
| 5,458,735 A | 10/1995 | Richter et al. | |
| 5,614,435 A | 3/1997 | Petroff et al. | |
| 5,920,078 A | 7/1999 | Frey et al. | |
| 6,638,358 B1 | 10/2003 | You et al. | |
| 6,930,330 B2 | 8/2005 | Choi et al. | |
| 7,112,862 B2 | 9/2006 | Lee et al. | |
| 7,153,754 B2 | 12/2006 | Farnworth et al. | |
| 7,247,885 B2 | 7/2007 | Rankin et al. | |
| 7,262,487 B2 | 8/2007 | Farnworth et al. | |
| 7,274,041 B2 * | 9/2007 | Homewood et al. | 257/87 |
| 7,285,502 B2 | 10/2007 | Farnworth et al. | |
| 7,294,848 B2 | 11/2007 | Bahl et al. | |
| 7,537,956 B2 | 5/2009 | Song et al. | |
| 7,670,862 B2 | 3/2010 | Song et al. | |
| 7,750,353 B2 | 7/2010 | Lee et al. | |
| 7,754,508 B2 | 7/2010 | Lee et al. | |
| 7,880,189 B2 | 2/2011 | Kttler et al. | |
| 2005/0087760 A1 | 4/2005 | Canham et al. | |
| 2005/0224817 A1 | 10/2005 | Park et al. | |
| 2007/0263690 A1 | 11/2007 | Homewood et al. | |

(Continued)

FOREIGN PATENT DOCUMENTS

| | | |
|---|---|---|
| JP | 2000-357818 A | 12/2000 |
| JP | 2007-027298 A | 2/2007 |

OTHER PUBLICATIONS

Gaponenko, . "Sol-Gel Derived Films in Meso-Porous Matrices: Porous Silicon, Anodic Alumina and Artificial Opals." Synthetic Metals. 124. (2001): 125-130.*

(Continued)

*Primary Examiner* — Samuel Gebremariam
*Assistant Examiner* — Lauren R Bell (57) ABSTRACT

A semiconductor optical emission device comprising a layer of material containing a plurality of stress variations and adhering to a surface of a semiconductor is described. In one embodiment the semiconductor is an indirect band gap semiconductor and is silicon in one aspect, the material of the layer comprises silicon and metal oxides and is prepared by a sol-gel process including thermal annealing in one aspect. The layer urges a plurality of randomly distributed elastic deformations in the semiconductor that substantially enhances the radiative recombination interactions among free carriers in the semiconductor.

5 Claims, 6 Drawing Sheets

(56) References Cited

U.S. PATENT DOCUMENTS

| | | |
|---|---|---|
| 2008/0012074 A1 | 1/2008 | Braymer et al. |
| 2008/0128713 A1 | 6/2008 | Saito et al. |
| 2008/0296593 A1 | 12/2008 | Park et al. |
| 2009/0121236 A1 | 5/2009 | Worley |
| 2009/0256262 A1 | 10/2009 | Farnworth et al. |
| 2011/0220956 A1 | 9/2011 | Chu et al. |

OTHER PUBLICATIONS

Miritello et al. Synthesis and luminescence properties of erbium silicate thin films, Materials Science and Engineering: B, vol. 146, Issues 1-3, Jan. 15, 2008, pp. 29-34.*

Isshiki, et al. Self-assembled infrared-luminescent Er—Si—O crystallites on silicon, Appl. Phys. Lett. 85, 4343 (2004).*

Janssen et al. Elastic deformation of silicon (001) wafers due to thin film stresses, Appl. Phys. Lett. 91, 121913 (2007).*

Xie et al. Synthesis of Er3+-doped silicon-based light emitting material by sol-gel method. Proc. SPIE vol. 3942, p. 282-287, Rare-Earth-Doped Materials and Devices IV, Shibin Jiang; Ed.*

R.A. Weimer et al., "Electronic properties of sol-gel derived oxides on silicon," Applied Physics Letters, vol. 51, No. 15, pp. 1178-1181 (Oct. 12, 1987). DOI: 10.1063/1.98725.

W.L. Warren et al., "Deposition of high-quality sol-gel oxides on silicon," Journal of Electronic Materials, vol. 19, No. 5, pp. 425-428 (May 1990). DOI: 10.1007/BF02658001.

T. M. Parrill, "Heat treatment of spun-on acid-catalyzed sol-gel silica films," Journal of Materials Research, vol. 9, No. 3, pp. 723-730 (Mar. 1994) DOI: 10.1557/JMR.1994.0723.

M. A. Green et al., "Efficient silicon light-emitting diodes," Nature, vol. 412, issue 6849, pp. 805-808 (Aug. 23, 2001). DOI:10.1038/35090539.

C. Kittel, "Exciton Condensation into Electron-Hole Drops (EHD)," in Introduction to Solid State Physics, 8th ed. (Wiley 2005), Chap. 15, pp. 441-444. ISBN 0-471-41526-x.

S. Abedrabbo et al., "Room-temperature silicon band-edge photoluminescence enhanced by spin-coated sol-gel films," Scripta Materialia, vol. 65, pp. 767-770 (Jul. 20, 2011) DOI: 10.1016/j.scriptamat.2011.07.025.

M. Helm et al., "Efficient light emitting diodes based on nanoscale silicon," Physica Status Solidi C, vol. 2, issue 8, pp. 2941-2946 (May 4, 2005) DOI: 10.1002/pssc.200460702.

M. A. Laurenco et al., "Boron engineered dislocation loops for efficient room temperature silicon light emitting diodes,"Thin Solid Films vol. 504, pp. 36-40 (Sep. 29, 2005) DOI: 10.1016/j.tsf.2005.09.036.

S. S. Iyer et al., "Light Emission from Silicon," Science, vol. 260, pp. 40-46 (Apr. 2, 1993) DOI: 10.1126/science.260.5104.40.

M. A. Fardad, "Catalysts and the structure of SiO2 sol-gel films," Journal of Materials Science, vol. 35, pp. 1835-1841 (2000) DOI: 10.1023/A:1004749107134.

M. A. Fardad et al., "Effects of H2O on structure of acid-catalysed SiO2 sol-gel films," Journal of Non-Crystalline Solids, vol. 183, issue 3, pp. 260-267 (Apr. 2, 1995) DOI: 10.1016/0022-3093(94)00661-X.

S. Abedrabbo et al., "Analytical study of thermal annealing behaviour of erbium emission in Er2O3-sol-gel silica films," Journal of Physics D: Applied Physics, vol. 44, pp. 315401:1-6 (Jul. 14, 2011).

\* cited by examiner

SEMICONDUCTOR OPTICAL EMISSION DEVICE

CROSS REFERENCE TO RELATED APPLICATIONS

Not Applicable.

STATEMENT REGARDING FEDERALLY SPONSORED RES. OR DEVELOPMENT

Not Applicable.

BACKGROUND

Prior Art

The following is a tabulation of some prior art that presently appears relevant:

U.S. PATENTS

| Pat. No. | Kind Code | Issue Date | Patentee |
|---|---|---|---|
| U.S. Pat. No. 4,529,455 | — | Jul. 16, 1985 | Bean et al. |
| U.S. Pat. No. 4,652,467 | — | Mar. 24, 1987 | Brinker et al. |
| U.S. Pat. No. 5,012,304 | — | Apr. 30, 1991 | Kash et al. |
| U.S. Pat. No. 5,324,965 | — | Jun. 28, 1994 | Tompsett et al. |
| U.S. Pat. No. 5,614,435 | — | Mar. 25, 1997 | Petroff et al. |
| U.S. Pat. No. 6,638,358 | B1 | Oct. 28, 2003 | You et al. |
| U.S. Pat. No. 7,247,885 | B2 | Jul. 24, 2007 | Rankin et al. |
| U.S. Pat. No. 7,274,041 | B2 | Sep. 25, 2007 | Homewood et al. |
| U.S. Pat. No. 7,294,848 | B2 | Nov. 13, 2007 | Bahl et al. |
| U.S. Pat. No. 7,750,353 | B2 | Jul. 6, 2010 | Lee et al. |
| U.S. Pat. No. 7,754,508 | B2 | Jul. 13, 2010 | Lee et al. |
| U.S. Pat. No. 7,880,189 | B2 | Feb. 1, 2011 | Kittler et al. |

U.S. PATENT APPLICATION PUBLICATIONS

| Publication No. | Kind Code | Publ. Date | Applicant |
|---|---|---|---|
| 2005/0087760 | A1 | Apr. 28, 2005 | Canham et al. |
| 2009/0256262 | A1 | Oct. 15, 2009 | Farnworth et al. |

FOREIGN PATENT DOCUMENTS

| Foreign Doc. No. | Cntry. Code | Kind Code | Publ. Date | Appl. or Patentee |
|---|---|---|---|---|
| 2000-357818 | JP | A | Dec. 26, 2000 | Terajima |
| 2007-027298 | JP | A | Feb. 1, 2007 | Takayoshi et al. |

NON-PATENT LITERATURE DOCUMENTS

R. A. Weimer et al., "Electronic properties of sol-gel derived oxides on silicon," *Applied Physics Letters*, vol. 51, no. 15, pp. 1179-1181 (Oct. 12, 1987).

W. L. Warren et al., "Deposition of high-quality sol-gel oxides on silicon," *Journal of Electronic Materials*, vol. 19, no. 5, pp. 425-428 (May, 1990).

T. M. Parrill, "Heat treatment of spun-on acid-catalyzed sol-gel silica films," *Journal of Materials Research*, vol. 9, no. 3, pp. 723-730 (March, 1994)

M. A. Green et al., "Efficient silicon light-emitting diodes," *Nature*, vol. 412, issue 6849, pp. 805-808 (Aug. 23, 2001).

C. Kittel, "Exciton Condensation into Electron-Hole Drops (EHD)," in *Introduction to Solid State Physics*, $8^{th}$ ed. (Wiley 2005, ISBN 0-471-41526-x), Chap. 15, pp. 441-444.

In relation to solid-state light-emission devices, optical emission from an indirect band gap semiconductor is intrinsically weak because direct transitions of electrons from the conduction to valence bands do not take place. In semiconductor silicon, recombination of electrons and holes releases energy that is emitted as optical radiation and non-radiative heat dissipation, with the latter being commonly dominant. The transitions producing heat may take place in steps due to trapping levels located in the forbidden gap between the conduction and valance bands. In the prior art, various approaches were taken to facilitate optical emission at room temperature from indirect band-gap semiconductors. Background includes structures fabricated in semiconductors and films formed on semiconductors.

Confinement of electron and hole carriers within a localized region of the semiconductor provides a way for reducing the migration of the carriers to non-radiative defect sites or traps. This may increase the likelihood of recombination of electrons and holes with emission of optical radiation. In U.S. Pat. No. 7,247,885 (2007) to Rankin et al. and U.S. Pat. No. 7,294,848 (2007) to Bahl et al., two group IV semiconductors in particular silicon, germanium, silicon-germanium alloys, and alloys containing carbon, are juxtaposed and located within the device. These heterogeneous semiconductor structures produce local crystal modifications, principally in the forms of strains and changes in the band gap. Since the method specifies materials to be embedded within the semiconductor, it imposes potentially undesired constraints on devices thereby fabricated.

At reduced temperatures an electron and a hole in silicon or germanium recombine coherently to produce a bound state known as an exciton. Excitons also emit optical radiation. Pressing a set screw against a surface of a germanium crystal produces a localized strain that confines the excitons to a region adjacent to the applied force. At a temperature near 3 Kelvins absolute, the confined excitons may condense and form an electron-hole drop. Near room temperature electrons and holes recombine incoherently, and very few excitons are formed. Therefore, methods for exciton confinement are impractical for devices operating substantially near room temperature.

In U.S. Pat. No. 5,012,304 (1991) to Kash et al., wire and dot shaped patterns in strained over-layers are used to confine excitons in a direct band-gap semiconductor. The strain pattern is asserted to be substantially unlimited. While exciton confinement in a strained semiconductor is demonstrated, the intensity of emission radiation at the temperature of 5 Kelvins is as little as 20% of that from unpatterned samples. In several respects, the method of Kash et al. is detrimental if it were applied to an indirect band-gap semiconductor device operated at room temperature. In order to confine excitons, the strain pattern by design produces a localized and isolated potential-energy well in the semiconductor. Because this method concentrates strain underneath the pattern, there are large gradients, or spatial variations, of strain near the edges of the pattern that determine the boundaries of the potential-energy well. The large strain gradients may cause plastic deformation and damage to the semiconductor. This method, which uses strain for lateral confinement, has the effect of reducing optical emission. It is impractical for enhancing optical emission from an indirect band-gap semiconductor at temperatures substantially near room temperature.

Several patents provide relevant background information on strain in semiconductors. U.S. Pat. No. 5,614,435 (1997) to Petroff et al. describes methods for growing films with islanded strain patterns on semiconductors and mentions growing germanium films on silicon. Various criteria that limit the growth of strained germanium-silicon alloy films on silicon are described in U.S. Pat. No. 4,529,455 (1985) to Bean et al. Near a critical magnitude of stress, the strain relaxes or decreases through the formation of crystal defects including dislocations and stacking faults in the semiconductor. Nevertheless, Petroff et al. and Bean et al. do not consider their various structures in relation to optical emission from indirect band-gap semiconductors.

Dislocations in semiconductors produce strains. As presented in U.S. Pat. No. 7,274,041 (2007) to Homewood et al., dislocations are created in silicon by implanting an atomic species and boron in particular, followed by thermal annealing. Carrier confinement is associated with very high strain fields near dislocations. Precipitation of excess boron also influences the charge carriers. In U.S. Pat. No. 7,880,189 (2011) to Kittler et al., dislocations are formed by joining two twist-misaligned semiconductors. Japanese patent document 2000-357818 (2000) to Terajima utilizes a layer containing defects and dislocations as a light emitting element. Generally, non-radiative carrier recombination at crystal defects including dislocations and precipitates serves to counteract theoretical and potential benefits for light emission from semiconductors.

Carriers can be confined in small semiconductor structures fabricated by methods of nano-technology. In U.S. Pat. No. 5,324,965 (1994) to Tompsett et al. and U.S. patent application 2005/0087760 (2005) by Canham et al., electroluminescent devices are fabricated in porous silicon. A drawback of porous silicon is interference or incompatibility with common practices in processing silicon wafers. Japanese patent document 2007-027298 (2007) to Takayoshi et al. describes a semiconductor light emitting device comprising nano-structure columns or pillars formed by selective hetero-epitaxial growth of compound semiconductor material. A claimed advantage is the absence of threading dislocations. The various shaped semiconductor structures produced by nano-technology methods in prior art narrow the scope of their utility and impede their process integration, in particular for a technology combining optics and electronics.

By considering a physical principle of reciprocity between optical and electronic properties of semiconductors, a high efficiency silicon photo-detector may also serve as a high efficiency silicon light-emitting device or LED. A silicon diode described by Green et al. (non-patent publication, 2009) has low levels of non-radiative surface and volume defects and 25% efficiency. Diodes are fabricated by this method in high-purity zone-refined silicon-crystal material. Owing to the high cost and scarcity of zone-refined silicon wafers, this method is impractical for integrating or combining optically active devices with electronics and is particularly costly for making discrete devices.

Prior art concerning insulating films on silicon is discussed in patent and non-patent literature. U.S. patent application 2009/0256262 (2009) by Farnworth et al. discloses porous insulative materials for imparting reduced dielectric constants in semiconductor devices. U.S. Pat. No. 6,638,358 (2003) to You et al. utilizes spin-on deposition and thermal curing, as an alternative to chemical vapor deposition, in forming a dielectric spacer layer in a semiconductor device. Publications in the technical literature by Weimer et al. (1987), Warren et al. (1990), and Parrill (1994) describe deposition of silica (silicon dioxide) films on silicon using sol-gel processes. These and other practices using liquid pre-cursor coatings for producing dielectric layers are similar to the sol-gel film deposition process taught in U.S. Pat. No. 4,652,467 (1987) to Brinker et al. Deposited on semiconductors, sol-gel films provide certain advantages for electronic devices by avoiding or reducing the risk of physical damage to the underlying semiconductor material. Analyses by electrical measurements on devices indicate that heat treatment or thermal annealing reduces defects at the interface between sol-gel films and silicon. However, sol-gel and other film deposition methods of prior art neither consider nor mention any byproduct concerning optical emission from any semiconductor.

BRIEF SUMMARY

In accordance with one embodiment, an optical emission semiconductor device comprises dielectric materials coating a surface of silicon, including a sol-gel film having a random distribution of internal stresses and strains. The sol-gel film urges or imposes a random distribution of elastic deformations in a region of the silicon that is adjacent to the sol-gel film. Electrons and holes in the silicon advantageously recombine, yielding substantial emission of optical radiation from the silicon. Light-emitting devices for several embodiments are described and illustrated in the drawings.

Advantages

Accordingly several advantages of one or more aspects are as follows: to provide a method for obtaining optical emission from within an indirect band-gap semiconductor and silicon in particular, that enables emission of optical radiation corresponding to the energy band gap, that produces emission radiation at ambient temperatures and at practical levels of intensities for electronic and optical devices, that uses processes compatible for integrating optical and electronic devices in silicon microelectronics fabrication, and that is cost effective for making silicon-based optical-electronic devices. Other advantages of one or more aspects for electronic and optical devices will be apparent from a consideration of the drawings and ensuing description.

BRIEF DESCRIPTION OF THE SEVERAL VIEWS OF THE DRAWINGS

So that those having ordinary skill in the art will have a better understanding of how to make and use the disclosed devices and methods, reference is made to the accompanying drawings. Closely related drawings have the same number but different alphabetic suffixes. The following describes the drawings, wherein.

DRAWINGS

Reference Numerals

First digit of drawing numeral corresponds to figure number, wherein:

| | | | |
|---|---|---|---|
| 100 | top surface | 101 | article |
| 105 | layer | 110 | sol-gel layer |
| 112 | network | 114 | region |
| 116 | region | 120 | interface |
| 130 | semiconductor | 132 | region |
| 133 | interface | 134 | region |
| 140 | face | 202 | datum |
| 204 | datum | 301 | spectrum |
| 302 | spectrum | 304, 306 | data |
| 308 | curve | 401 | device |
| 410 | layer | 414 | interface |
| 416, 418 | electrodes | 420 | silicon region |
| 422, 424 | silicon region | 430 | oxide layer |
| 440 | substrate | 500 | surface of layer |
| 510 | layer | 512 | inclusion |
| 514 | inclusion | 516 | material |
| 518 | interface | 520 | interface |
| 530 | semiconductor | 532 | region |
| 533 | interface | 534 | region |
| 540 | face | 600 | surface |
| 602 | surface element | 603 | thick layer |
| 605 | surface element | 606 | thinner layer |
| 607 | curved surface | 608 | curved surface |
| 610 | layer | 620 | interface |
| 630 | semiconductor | 632 | region |
| 633 | interface | 634 | region |
| 640 | face | 701 | article |
| 710 | protrusion | 720 | layer |
| 740 | semiconductor | 801 | article |
| 810 | hills | 815 | valleys |
| 820 | layer | 840 | semiconductor |
| 901 | device | 912 | layer |
| 913 | surface | 914 | interface |
| 916, 918 | electrodes | 920 | semiconductor region |
| 922, 924 | doped semiconductor regions | 930 | insulator |
| 940 | substrate | | |

DETAILED DESCRIPTION

FIGS. 1-4—First Embodiment

Figure 1A:
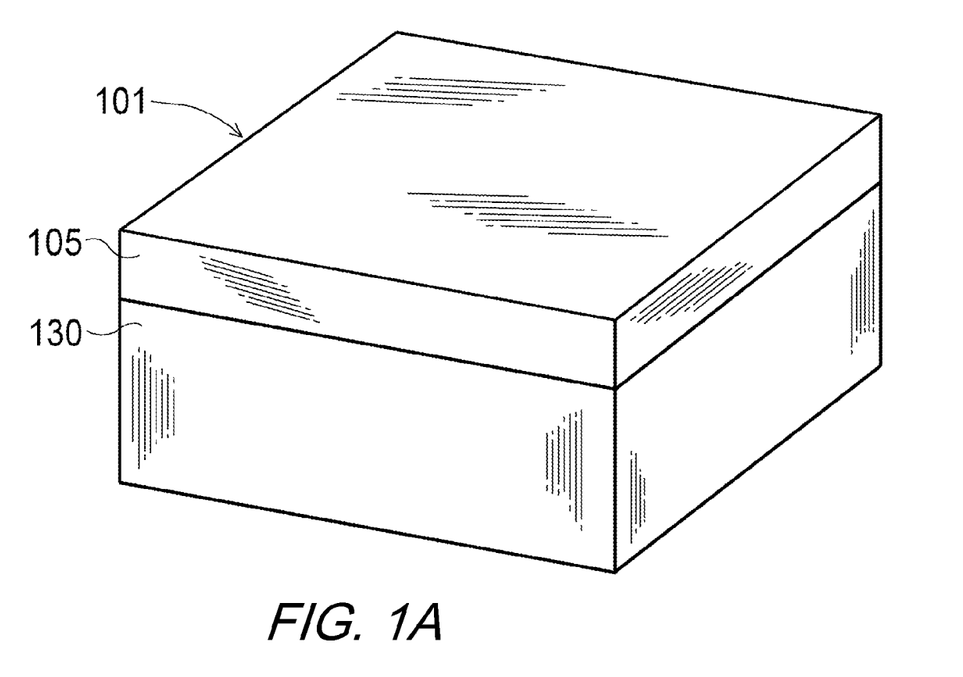
FIG. 1A is a perspective view of a semiconductor coated with a layer.

A first embodiment of a semiconductor light emission device comprises an article 101 illustrated in FIG. 1A. A first material forming a layer 105 is disposed on a surface of a semiconductor 130. The material of the layer 105 has a plurality of variations in internal mechanical stresses. Other materials and components adjacent to and contiguous with the article, with details exemplified in subsequent drawings, form a complete device. The layer 105 adheres to and is contiguous with the semiconductor 130. The semiconductor 130 is typically an indirect band gap semiconductor, and in particular crystalline silicon. Materials suitable for the layer 105 are formed by thermal processing and other methods. At present an embodiment with a sol-gel process followed by a thermal anneal for forming the layer 105 is believed to operate most efficiently, but other embodiments are also satisfactory. Layers formed by sol-gel processes are commonly denoted as sol-gel layers and sol-gel films.

Figure 1B:
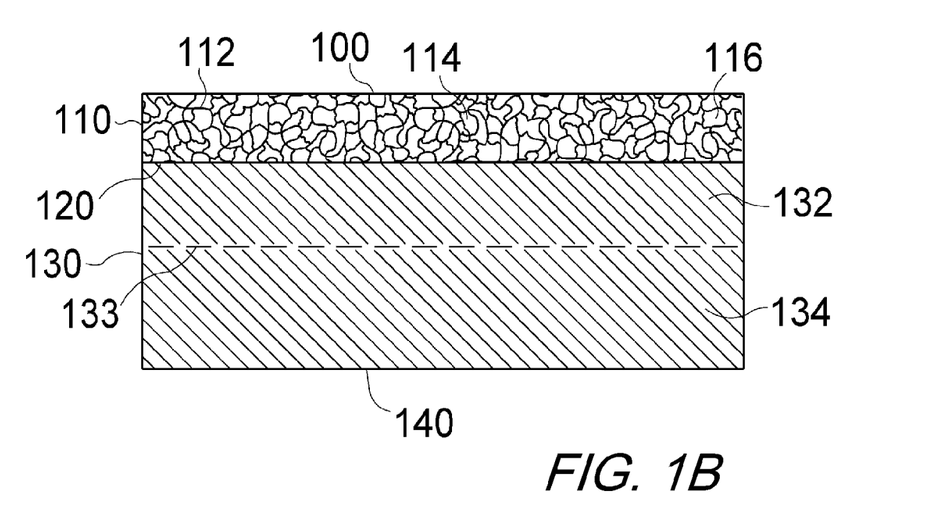
FIG. 1B is a cross section view of a semiconductor coated with a sol-gel layer.

FIG. 1B is a cross section view of an aspect of the article 101. A sol-gel process deposits a sol-gel layer 110. The sol-gel layer 110 is microscopically inhomogeneous, comprising variations in density, stress, porosity, chemical composition, and other material attributes. A network 112 of randomly meandering, intersecting, and curved lines represents material and structure within the sol-gel layer 110. Regions 114 and 116 exemplify several regions in the sol-gel layer 110 comprising different materials and structures. Different spacings between the meandering lines in FIG. 1B distinguishes the region 114 from the region 116. Variations in the internal material and structure of the sol-gel layer 110 supports static mechanical stresses and a plurality of random variations in mechanical stresses including random variations in mechanical strains. The sol-gel layer 110 urges forces on the materials upon which it adheres, and in particular the semiconductor 130. The sol-gel layer 110 and the semiconductor 130 form an interface 120.

The semiconductor 130 contains a plurality of random elastic deformations. Plastic deformation, crystal defects, and other forms of structural damage in the semiconductor 130 are substantially absent. A region 132 in the semiconductor 130 contains a substantial variation in static elastic deformations, owing to a close proximity to the sol-gel layer 110. A region 134 in the semiconductor 130 has comparatively smaller elastic deformations, owing to progressive weakening of random elastic deformations with increasing distance from the sol-gel layer 110. An interface 133 distinguishes the region 132 from the region 134. The region 132 smoothly and continuously connects to the region 134, wherein the random deformations vary smoothly and continuously across the interface 133. The interface 120 and the interface 133 are two boundaries of region 132. The region 132 has a predetermined thickness about equal to the thickness of the sol-gel layer 110. In an aspect of the article 101, a thickness of the region 134, wherein two boundaries are the interface 133 and a face 140, is advantageously a predetermined thickness comprising a relatively small portion of the thickness of the semiconductor 130.

The region 132 is substantially more optically active than the region 134.

Optical emission rays are collected and transmitted externally utilizing a light-emitting device comprising an aspect of the article shown in FIG. 1B. In a first aspect the emission is collected at a top surface 100. A second aspect collects emission laterally through the sol-gel layer 110. A third aspect collects emission at the face 140, wherein region 134 is substantially thicker than region 132. A fourth aspect guides the emission laterally, including rays emitted through lateral facets in the region 132 and the region 134.

Process—Sol-Gel Layer 110

Generally, numerous techniques for sol-gel processing are broadly understood in the technical literature, given the tens of thousands of publications on the relevant science and technology. An aspect for forming the sol-gel layer 110 is a sol-gel process for depositing a film comprising oxides of silicon and other elements. The sol-gel layer 110 contains random stresses that urge random forces at the interface 120 that in turn cause random elastic deformations in the region 132. Trivalent atoms, including boron, aluminum, titanium, or a lanthanide element are commonly incorporated in sol-gel processes. In a solution or sol, a metal alkoxide reacts with water or hydrolyzes to grow metal-oxide polymers. The solution is diluted with methyl alcohol, although other dilutants or thinning agents may be used. The reaction described herein uses an acid as a catalyst for the hydrolysis reaction, although a base is also a catalyst.

The silicon used for the semiconductor 130 is an electronic-grade bulk-wafer material and is grown as a boule or large crystal by a Czochralski or seed-pulling method, sliced into wafers, and polished. The silicon contains oxygen impurities and boron doping that makes the silicon a p-type conductor with a conductivity of about 10 Ohm-cm. N-type silicon, epitaxial silicon, silicon-on-insulator, and other types of silicon wafers and dopings customarily used in fabricating semiconductor devices can also be used. Another indirect band-gap semiconductor disposed on another type of substrate material can also be used.

The silicon is cleaned by a method that leaves a native or chemical oxide, forming a hydrophilic surface capable of being wetted by aqueous solutions and the sol of the sol-gel process in particular. Aspects of cleaning methods include using acids, bases, oxidants, organic solvents, and water, and including drying the surface after wet or vapor cleaning. An example is the commonly used RCA method, including treatment with hydrofluoric acid that produces a hydrophobic surface, and treatment with de-ionized water containing ozone that produces a hydrophilic surface.

The sol is deposited on the silicon by spin-coating. Other methods, including dipping and spraying, can also be used. A gelled film is formed as the solvents and volatiles, principally water and alcohol, evaporate into the ambient during the spinning. Thermal curing yields the desired stress properties in the sol-gel layer 110.

Sols containing high water content and moderately low chemical pH produce branched polymer morphologies and stressed films upon annealing, as described by Brinker et al. (1987) and studied by Parrill (1994).

A particular sol formulation is described herein and is believed to operate efficiently, recognizing that advantages and alternative compositions will become apparent to one practiced in the art. The metal alkoxide is silicon ethoxide, also known as tetra-ethyl ortho-silicate and abbreviated as TEOS. Hydrolysis of the TEOS uses water-to-TEOS in molar proportion or ratio of 10 to 1. The catalyst is acetic acid, which is a weak acid, in molar proportion 0.8 to 1 of acid to water. A weak acid is advantageous for controlling or buffering the pH of the solution. However, strong acids, including hydrochloric acid, are more commonly used in sol-gel film processing. In the case of a strong acid, a lower concentration of acid is used. An organic acid, including acetic acid, has further advantages of reducing unintentional doping of the semiconductor and reducing damage to electronic components from reactive anions.

The added elemental compound is erbium oxide, which is mixed in molar proportion 1 to 7 of erbium oxide to TEOS. While certain elements readily diffuse into or react with silicon, erbium has the dual advantages of low solid solubility and solid-state diffusivity in silicon at a typical processing temperature of about 700° C. Oxides, hydroxides, carbonates and other compounds of other elements, including other trivalent elements, can be substituted for erbium oxide to provide a similar function. The pH of the sol at the onset of the sol-gel reaction is estimated to be approximately 3.5. The solution is held at 80° C. for 10 min to activate a hydrolysis reaction, after which the prepared sol is ready for applying as a coating to form the sol-gel layer 110. Other temperatures and times may be used for the hydrolysis. The moderately low pH sol is estimated to be stable against gelation in the bulk for at least several hours, for holding temperatures at or slightly below room temperature.

The sol is applied through a filter in the form of a drop disposed onto and making immediate contact with the surface of the silicon used for semiconductor 130, which is rotated or spun at 1200 revolutions per minute. Deposition and film gelation is complete for spinning duration under 30 seconds. This produces a film of about 170 nanometers in thickness after drying at 120° C. Film thickness is controlled by the rotation rate, sol viscosity and other parameters specific to sol formulation including the pH and the oxide additive. For the preparation method described herein, the viscosity of the sol is about 0.013 Poise. Other sol viscosities, rotation speeds, rotation times, drying procedures, and film thicknesses may be used advantageously.

A thermal cure or a thermal anneal completes the sol-gel process. For the sol-gel formulation and deposition method described herein, the article of FIG. 1B is annealed at a temperature near 700° C. for duration of 1 hour in a chamber with a pressure of 2 Pascals. Other combinations of temperatures, times, ambient environments, and pressures can be substituted.

The thermal anneal grows a small amount of a silicon oxide at the interface 120 of about several nanometers in thickness. Forming the thermal oxide reduces the density of electronically-active defects at the interface 120. This is advantageous for reducing non-radiative electron-hole recombination at traps near the interface 120. Further advantage of the oxide is improved adherence of the sol-gel layer 110 to the silicon used for the semiconductor 130 at the interface 120. The cured sol-gel film comprises a silica-based glassy network, as illustrated schematically in FIG. 1B by the network 112 within the sol-gel layer 110.

Figure 2A:
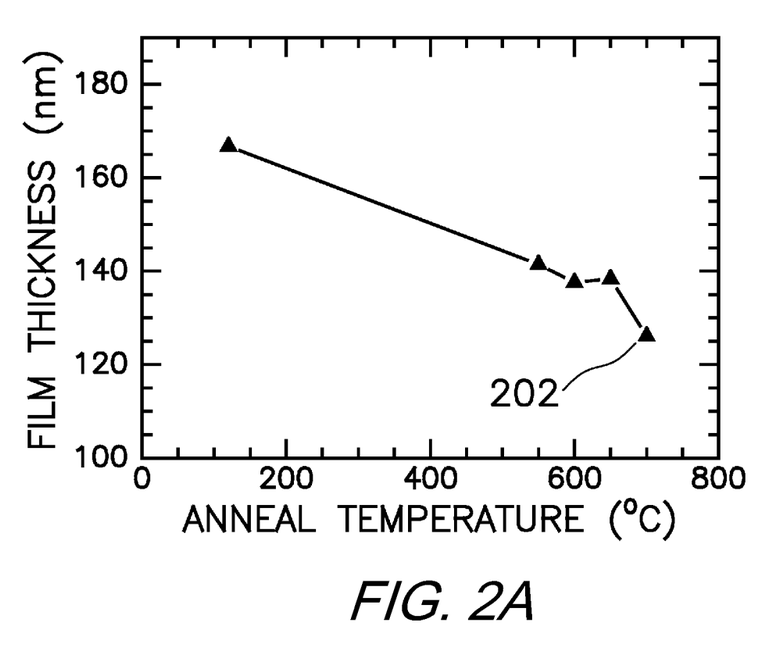
FIG. 2A shows the thickness of sol-gel films with anneal temperature.
Figure 2B:
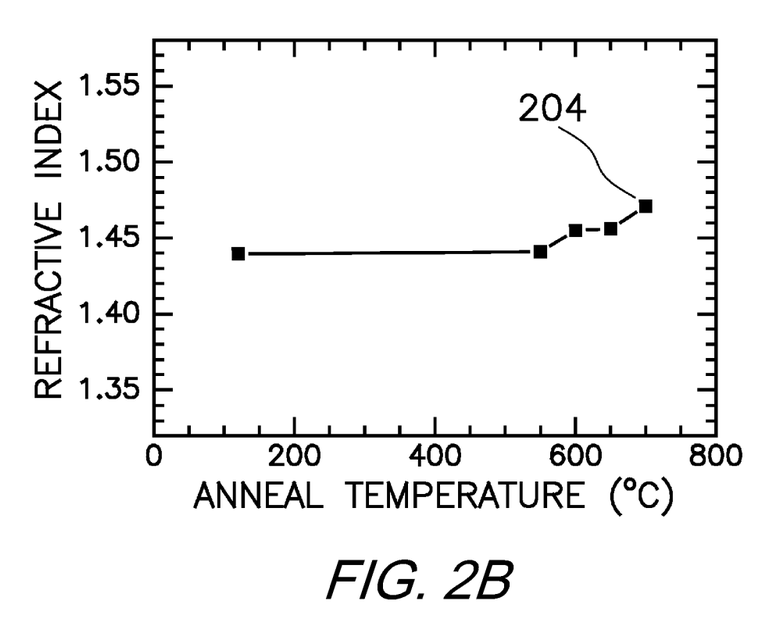
FIG. 2B shows the index of refraction of sol-gel films with anneal temperature.
Figure 3A:
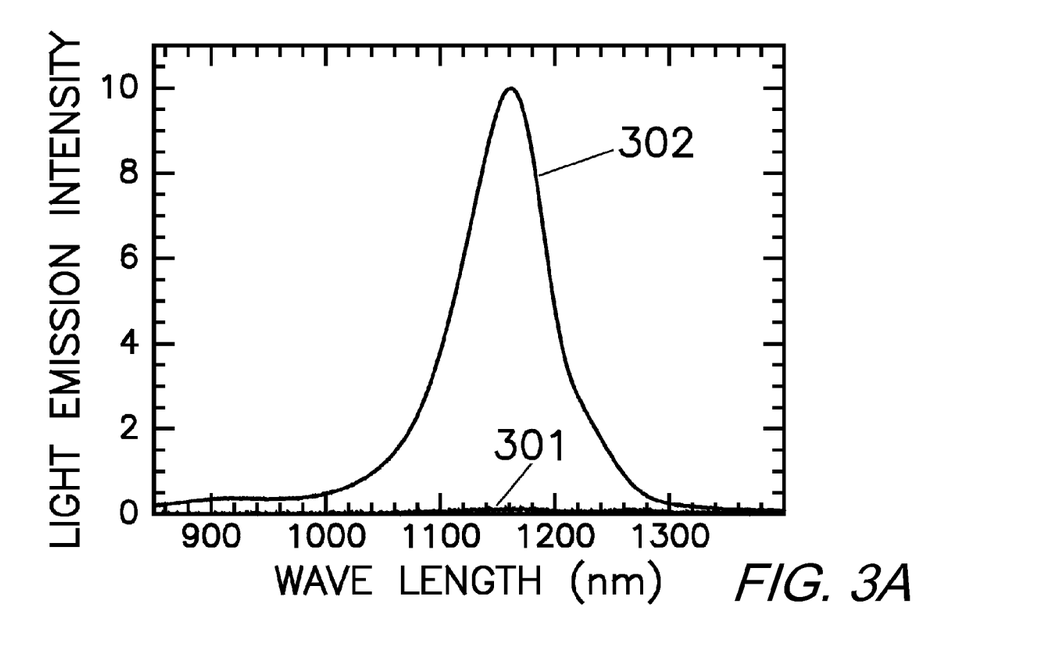
FIG. 3A shows spectra of light emission from silicon.
Figure 3B:
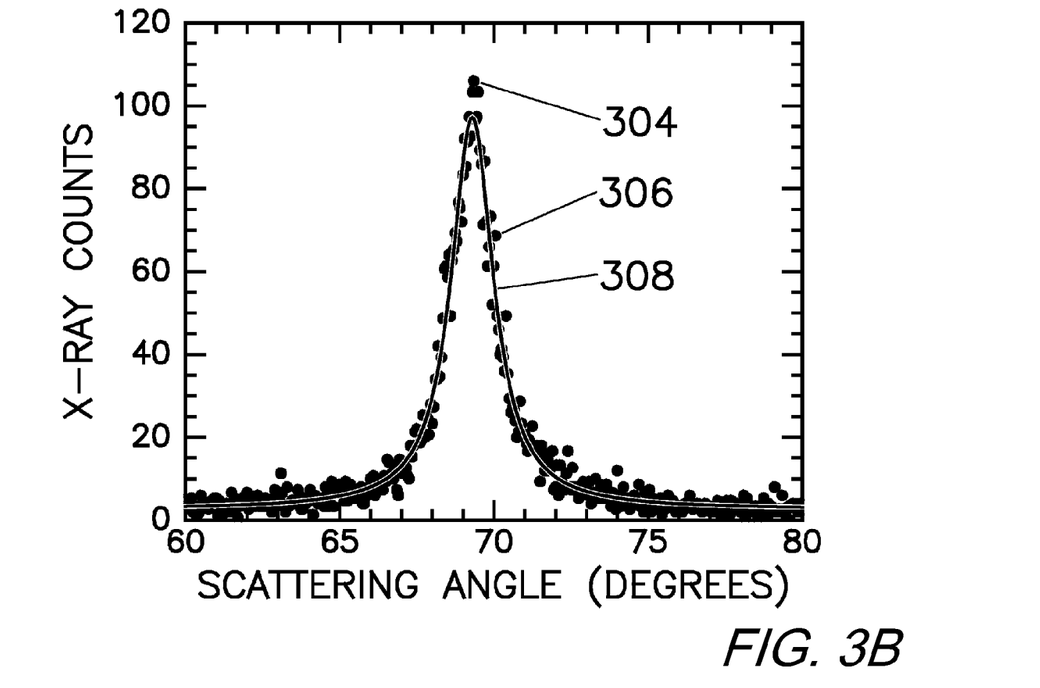
FIG. 3B shows an x-ray diffraction angular scan of silicon coated with a sol-gel layer.

Measured Properties—FIGS. 2, 3

One practiced in the art would employ known engineering principles by examining a range of sol preparations, techniques for coating, and treatments for annealing in order improve the process, layer or film, and optical performance described herein. This includes adapting the process steps to suit particular improvements or advantages in method, apparatus, facilities, and other capabilities.

Among the engineering metrics pertinent to process evaluation are measurements of a decrease in thickness and an increase in index of refraction of sol-gel films with an increase in anneal temperature. Data are shown in FIG. 2 for the aspect of the article 101 shown in FIG. 1B, wherein the above-described sol-gel process forms the sol-gel layer 110. Thicknesses of the sol-gel layer 110 for several anneal temperatures are shown in FIG. 2A. Optical indices of refraction of the sol-gel layer 110 at wavelength of 632 nm for several anneal temperatures are shown in FIG. 2B. The sol-gel layers shrink by as much as 25% and become more dense as the anneal temperature is increased. A datum 202 in FIG. 2A corresponds to a thickness of 126 nanometers. A datum 204 in FIG. 2B corresponds to an index of refraction of 1.471. The thermal oxide, being substantially thinner than the sol-gel film, may be detectable by some physical and chemical metrology methods. The data 202 and 204 are results obtained for an anneal temperature of 700° C.

The silicon used for the semiconductor 130 emits optical radiation at room temperature in the wave length region of the silicon energy-band gap. FIG. 3A shows photo-excited luminescence emission spectra for two examples. Emission in both examples is stimulated by photo-excitation with light at 522 nanometer wave length and at the same intensity for each. A spectrum 301 is obtained using a reference sample of the silicon. The emission is weak and difficult to resolve because the external quantum efficiency is very low and about 0.01%. A spectrum 302 is obtained using the article prepared with the sol-gel film on the silicon, as described above and with the anneal temperature of 700° C. The height of the peak or the maximum in the spectrum 302 is nearly 100 times greater than the height of the peak in the spectrum 301. From the spectrum 302, the radiation emitted from the region 132 has an external quantum efficiency of at least 1%. Radiation emitted from region 132 has an internal quantum efficiency substantially greater than 1%.

X-ray diffraction measures random deformations in the silicon used for the semiconductor 130. FIG. 3B displays an x-ray scan of the article described above and for the anneal temperature of 700° C. The scattering angle is in a plane containing the normal to the semiconductor and film surfaces. The number of x-rays diffracted from the undeformed silicon crystal lattice is comparatively weak because the cubic axis of the silicon crystal has been tilted slightly away from the x-ray scattering plane. The x-ray diffraction scan comprises exemplary data 304 and 306. A curve 308 represents a physical model corresponding to a Lorentzian mathematical function fitted to the x-ray data. Analysis of the width of the x-ray scattering function determines a mean deformation of 1.2% in the silicon, including the region 132. Data in the vicinity of the datum 304 lying above the curve 308 indicate a relatively small contribution from essentially undeformed silicon, including the silicon region 134 and portions of the region 132.

Emission Process

Emission of radiation in the spectrum 302 is strongest for wave lengths in the vicinity of 1160 nanometers. Examination of the dependence of light emission intensity as a function of wave length shows that emission producing the spectrum 302 originates from free electrons near the conduction band edge recombining with free holes near the valence band edge. Recombination of electrons and holes results in emission of photons, or quanta of optical radiation, and momentum-conserving optical phonons, or quanta of crystal-lattice vibrations. As distinct from the properties of direct band gap semiconductors, the electrons and holes in the silicon recombine in a random or uncorrelated manner. Owing to deformation of the silicon, the valence and conductions bands may become effectively less indirect, thereby promoting optical emission with reduced participation from phonons.

The electrons and the holes easily diffuse in the silicon. Random deformations, particularly in the silicon used for the region 132, cause elastic or energy-conserving scattering of the electrons and the holes. This type of scattering substantially reduces the diffusivities of the electrons and the holes in the silicon, when compared to undeformed silicon. Elastic scattering, including a substantial amount of back-scattering, improves the likelihood of mutual encounters between electrons and holes. The larger electron-hole scattering that ensues increases the probability that the electrons radiatively recombine with the holes.

The method of forming random elastic deformations in the semiconductor circumvents numerous disadvantages associated with confinement of charge carriers in various prior art. The described embodiment, and the aspect of the article 101 shown in FIG. 1B in particular, constitutes a new use for combining silicon and a sol-gel film.

Figure 4:
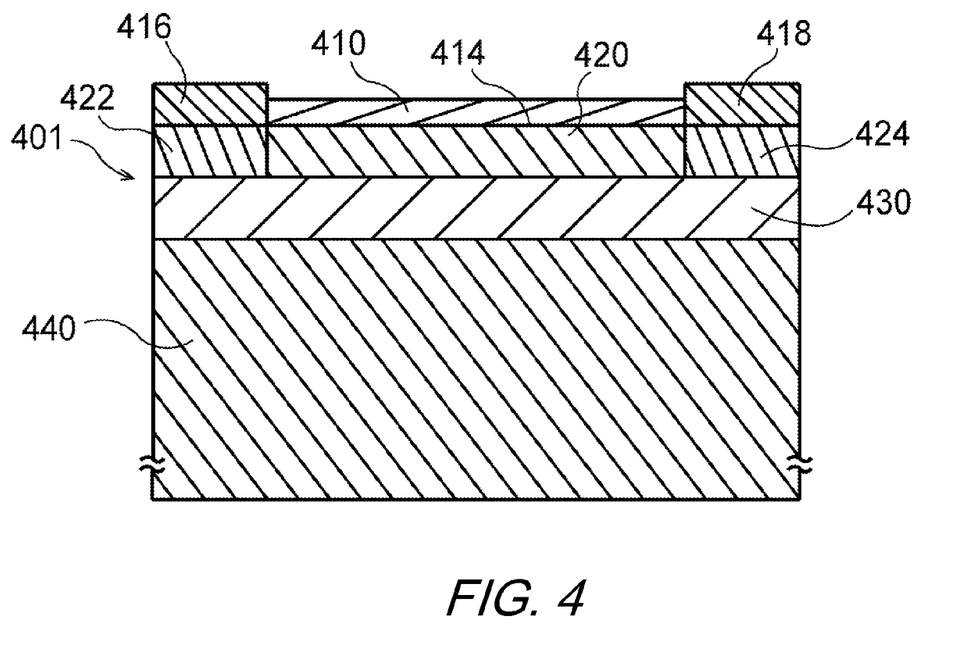
FIG. 4 is a section view of a light-emitting semiconductor device.

Optical Emission Device—FIG. 4

An aspect of an optical emission device is shown in cross section in FIG. 4. A device 401 comprises an aspect of the article illustrated in FIG. 1B. The device 401 is implemented in a silicon-on-insulator or an SOI wafer. The device comprises p-type and n-type regions in the semiconductor. Individuals practiced in the art would recognize methods for utilizing articles exemplified in FIGS. 1A and 1B in fabricating light emission devices in various configurations, including making silicon light-emitting devices for producing band-to-band light emission.

The SOI wafer comprises a substrate 440, an insulator, separator, or oxide layer 430, and a top silicon layer that becomes a silicon region 420, a silicon region 422, and a silicon region 424 after processing the finished device. The silicon regions 422 and 424 are formed along a perimeter of the silicon region 420. A layer 410 is a material comprising a plurality of randomly distributed stresses. An aspect of the layer 410 is a sol-gel film. The silicon region 420 has a predetermined thickness and is an aspect of the region 132 shown in FIG. 1B. An interface 414 is formed between the layer 410 and the silicon region 420.

The silicon regions 422 and 424 are doped with n or p type impurities and are covered with contacting electrodes 416 and 418, respectively. In a first aspect the silicon region 420 includes a p-n junction in a p-n device. In a second aspect the silicon region 420 comprises n-type, p-type, and intrinsic regions in a p-i-n device.

Operation—FIG. 4

Free electrons and holes are injected from the oppositely doped n-type or p-type silicon regions 422 and 424 in response to an electrical current introduced at electrodes 416 and 418. A plurality of random stress from layer 410 induces a plurality of random elastic deformations in the silicon region 420 of the device 401. Random elastic deformations in the silicon improve efficiency in the radiative recombination between the excess electrons and the excess holes, relative to the efficiency in the absence of the deformations.

In a first aspect of the device 401, the emitted light is gathered laterally through the oxide layer 430 by focusing the rays into an optical wave guide structure adjacent to the device. In a second aspect, light is emitted vertically through the layer 410. In the following several aspects of the device, gaps between silicon regions 422 and 424 provide lateral emission of the radiation directly from the silicon region 420. In a third aspect, the emission radiation is collected through lateral facets at the perimeter of the silicon region 420. In a fourth aspect, reflecting surfaces are included, such that a portion of the emission radiation returns to the silicon region 420. Stimulated emission of radiation from the silicon region 420 ensues, amplifying the light emission and obtaining phase-coherent optical emission. Other pathways to collect the emission radiation may be used advantageously. Other materials than SOI may be used, and in particular the device may be improved by substituting another material, including another optically transparent dielectric, for oxide layer 430.

Additional Embodiments

FIGS. 5-8

Figure 5:
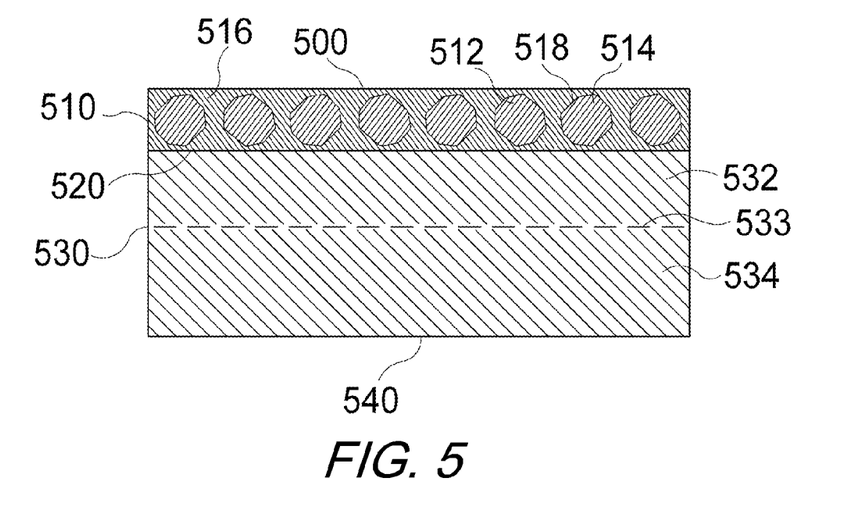
FIG. 5 is a cross section view of a semiconductor coated with a layer.

FIG. 5 is a cross section view of an article in a first additional embodiment. The drawing illustrates a layer 510 comprising an inhomogeneous material with an internal structure and disposed on silicon used for a semiconductor 530, wherein said semiconductor has a face 540. A process, which is a sol-gel or other process, forms the layer 510 from a material comprising a plurality of randomly dispersed inclusions in a matrix or a body of a material 516, and exemplified by an inclusion 512 and an inclusion 514. The layer 510 comprises a plurality of internal interfaces, exemplified by an interface 518, between the inclusions and the material 516.

Materials comprising the inclusions 512 and 514 and other similar constituents of the layer 510 are irregular in sizes and shapes, have differences in densities and stresses, and are contiguous with the material 516. In an aspect of the materials comprising the layer 510, the materials include a plurality of pores typically several nanometers in size. Internal structure of layer 510 supports a plurality of static stresses and spatial variations in stresses and strains.

Layer 510 forms an interface 520 contiguous with the silicon used for the semiconductor 530 and induces static deformations in the silicon. In an aspect the interface 520 comprises oxidation of the silicon. The semiconductor 530 comprises a randomly deformed region 532 adjacent to the layer 510 at the interface 520 and adjacent to a region 534 at an interface 533. The region 532 contains substantially greater random elastic deformations than the region 534.

Figure 6:
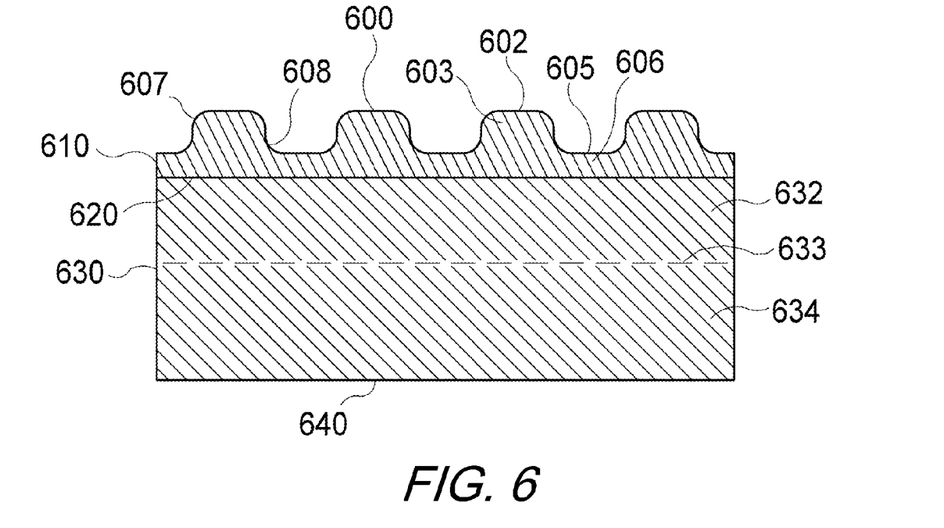
FIG. 6 is a cross section view of a semiconductor coated with a layer.

A second additional embodiment comprises an article illustrated in cross section in FIG. 6. The article contains a layer 610 that is disposed on a silicon material used for a semiconductor 630. The layer 610 forms an interface 620 contiguous with the semiconductor 630. In an aspect the interface 620 comprises oxidation of the silicon.

In an aspect of the layer 610, a surface 600 of the layer comprises a plurality of undulations. Undulations comprise a surface element 602 over a region of thicker layer 603, a surface element 605 over a region of thinner layer 606, an element of curved surface 607 with outside convex curvature, and an element of curved surface 608 with inside concave curvature. The curved surface elements continuously and smoothly connect to the other surface elements over the regions of the thicker and thinner layers.

Surface 600 of layer 610 comprises undulations formed in one or more lateral spatial directions. A plurality of predetermined corrugations, reticulations, and other features comprising the surface 600 provides the layer 610 with a plurality of predetermined thicknesses. Several aspects of the topology of the undulations in the surface 600 include smoothly rounded ridges, grooves, islands, bumps, dimples, or depressions in the surface 600. In a first aspect of the article, the undulations repeat in a regular manner. The undulations have a predetermined depth, comprising a predetermined difference in the thickness of the thicker layer 603 relative to the thickness of the thinner layer 606.

In a second aspect of the article, the surface 600 comprises a plurality of predetermined variations in spacings between undulations, sizes of undulations, and depths of undulations.

In a first aspect of forming the layer 610, the material of the layer comprises a film containing a tensile stress. In a second aspect of forming the layer 610, the material of the layer comprises a film with compressive stress. In the two aspects of materials and stress, undulations in thickness and the smoothly rounded curvatures in the surface 600 urge a spatial variation of forces on a region 632. The forces produce deformations within the region 632 comprising a plurality of elastic compressions, dilations and shears. In the second additional embodiment, the deformations in the region 632 function as random elastic deformations in silicon. Another indirect band-gap semiconductor may be used in place of the silicon.

Stress in the layer 610 and undulation in the surface 600 determine the deformations induced in the region 632, including deformations in the interface 620. The smoothly rounded features in the undulations in the surface 600 reduces stress gradients and stress concentrations in the region 632 and at the interface 620. Silicon is susceptible to nucleation of lattice defects near the interface 620. The method of forming layer 610 particularly protects the region 632, the interface 620, and other regions in the silicon from stress-related damage. Defects in the semiconductor, in particular formation of dislocations, stacking faults, and other lattice slip effects during thermal processing, are thereby reduced. The article and the method of the second embodiment substantially reduce a risk of forming detrimental defects in the semiconductor 630.

Figure 7:
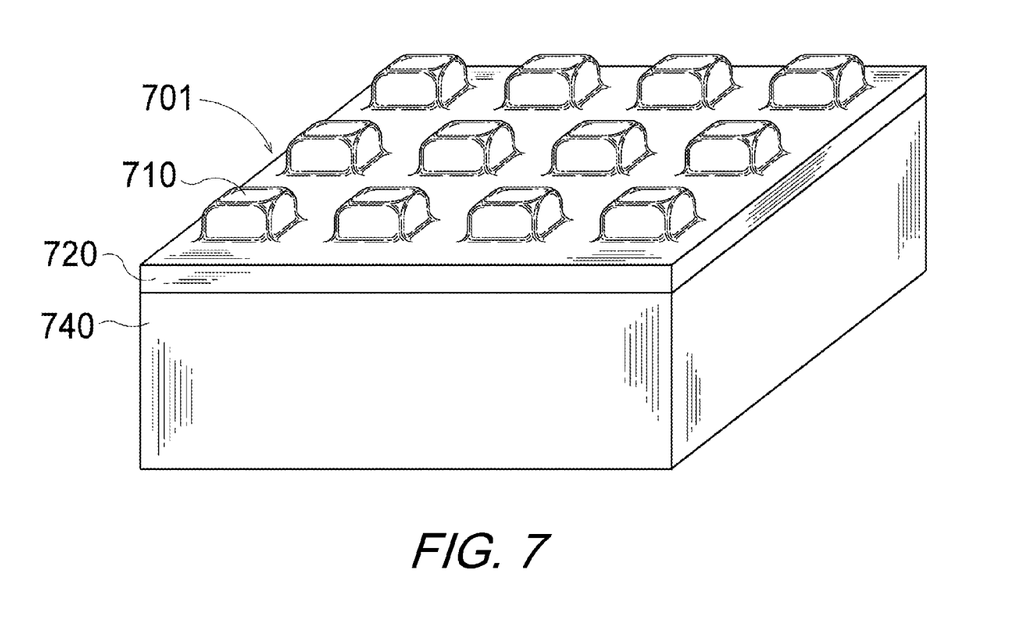
FIG. 7 is a view of a semiconductor coated with a layer.

A third additional embodiment comprises an article 701 illustrated in FIG. 7. A layer 720 comprises a plurality of thin and thick regions and is disposed on a semiconductor 740. A first aspect of the layer 720 comprises a plurality of rounded protrusions, exemplified by a protrusion 710. In a second aspect, rounded depressions, not illustrated, are used. In a third aspect a combination of protrusions and depressions are used. In a fourth aspect, protrusions and depressions are formed with other shapes and repeat in other patterns. In a fifth aspect, protrusions and depressions of unequal sizes and unequal spacings are used. In an aspect of forming the article 701, the semiconductor 740 is oxidized. The layer 720 urges deformations in the semiconductor 740 that are functionally equivalent to random elastic deformations in the semiconductor.

Figure 8:
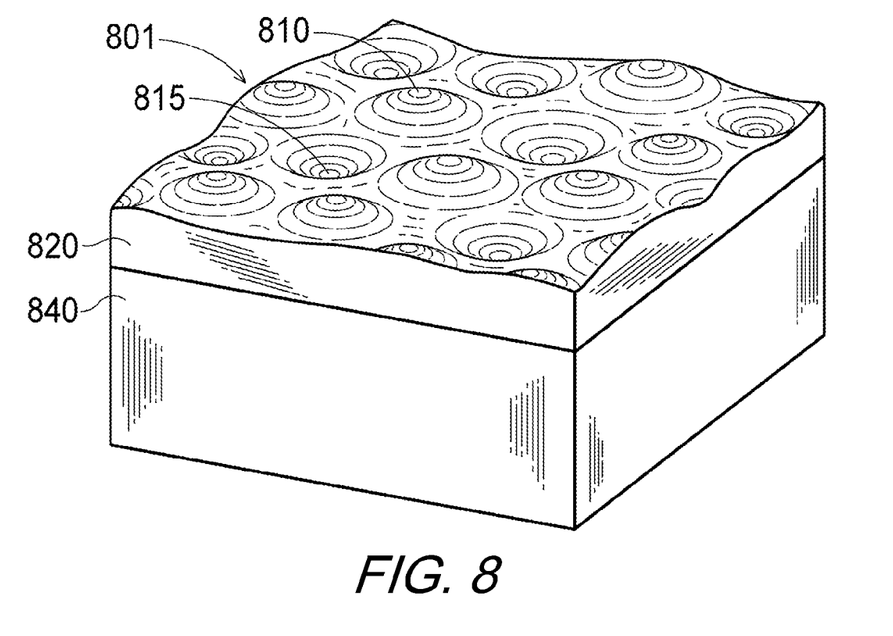
FIG. 8 is a view of a semiconductor coated with a layer.

A fourth additional embodiment comprises an article 801 shown in FIG. 8. A layer 820 comprising random variations in thickness is disposed on a semiconductor 840. The undulated surface of the layer 820 comprises a topology of hills 810 and valleys 815 of various sizes, spacings and elevations. In a first aspect of forming the layer 820, a material comprising segregation of a plurality of constituent materials is used. In a second aspect of forming the layer 820, a material comprising stress and a plurality of random thickness variations is used. In a third aspect of forming the layer 820, a material comprising a plurality of intrinsic stresses is used. In an aspect of forming the article 801 the semiconductor 840 is oxidized. The layer 820 urges random elastic deformations in an adjacent region of the semiconductor 840.

Figure 9:
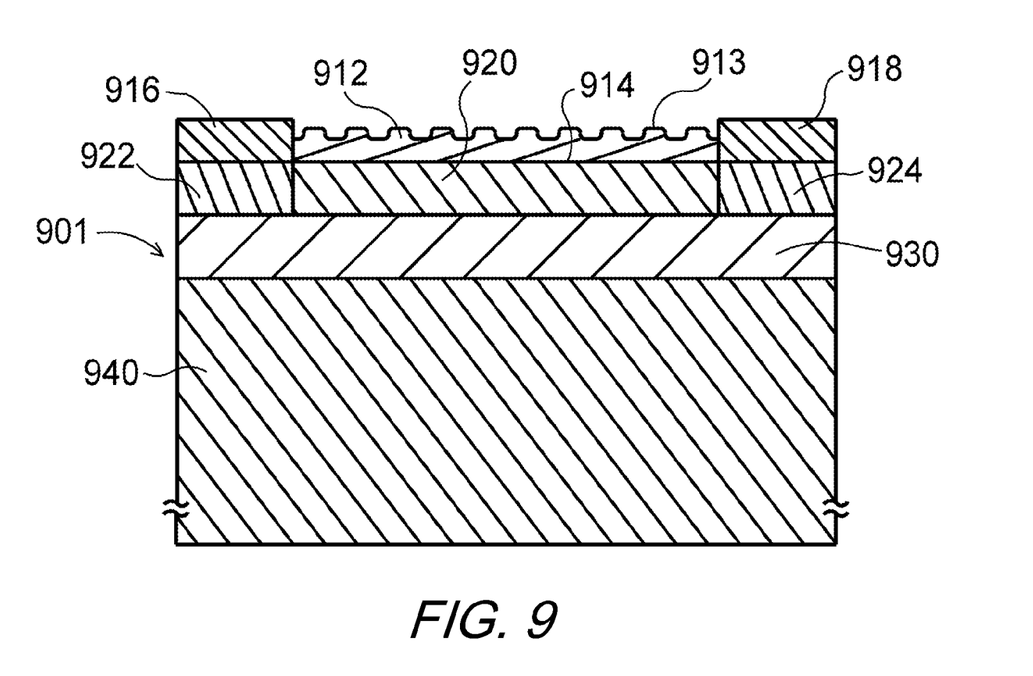
FIG. 9 is a section view of a light-emitting semiconductor device.

Optical Emission Device—FIG. 9

An optical emission device 901 in an additional embodiment is shown in cross section in FIG. 9. The device utilizes an aspect of the articles illustrated in FIGS. 6-8 in a silicon-on-insulator material or an SOI wafer, although other semiconductor material can be used. The device 901 comprises a layer 912 disposed on a semiconductor region 920 that is adjacent to doped semiconductor regions 922 and 924. Device 901 additionally comprises an insulator 930 and a substrate 940. The semiconductor region 920 functions similarly as the silicon region 420 in the device shown in FIG. 4. In an aspect of the device 901 an interface 914 between the layer 912 and the semiconductor region 920 comprises oxidation of the semiconductor.

The layer 912 has an undulated surface 913. In a first aspect of the surface 913, the undulations have uniform repetition. In a second aspect the undulations have non-uniform repetition. The device shown in FIG. 9 differs from the device shown in FIG. 4 in that the layer 912 differs from the layer 410.

A first aspect of the layer 912 includes the layer 610 shown in FIG. 6. A second aspect includes the layer 720 shown in FIG. 7. A third aspect includes the layer 820 shown in FIG. 8.

The several junctures comprising device elements 916, 922, 912, 914, and 920 at the left side of FIG. 9, and the several junctures comprising device elements 918, 924, 912, 914, and 920 at the right side of FIG. 9, are illustrated to be in alignment. Vertical or horizontal steps or offsets in one or more of these junctures may also be used, and similarly for the device in FIG. 4, for advantageous electrical and optical operation. Operation of the device in FIG. 9 follows in an analogous manner as the operation of the device in FIG. 4 as described above.

Alternative Embodiments

A semiconductor light emitting device comprises a layer containing variations in mechanical stresses disposed on a surface of a semiconductor. Alternative embodiments include other methods for forming an article with a particular stressed layer on silicon.

In a first alternative embodiment, the layer is deposited by a sol-gel process using relatively smaller proportion of water than in the first embodiment, containing in particular 5 molar parts water to 1 molar part alkoxide. Less water for hydrolysis produces a more linear like polymerization in a silicon-oxide network. This produces smaller pore sizes in the sol-gel film and reduces the length scale of the stress variations. On the other hand, relatively more water increases the branching of the polymer and increases porosity or pore size of the sol-gel film. Water hydrolysis provides flexibility in managing the stress distribution for a particular device.

A second alternative embodiment of a particular utility uses a sol-gel process with a basic solution, that is, a solution with a pH greater than 7. Catalysis with a high pH produces a colloidal suspension in the sol and a colloid-induced stress texture in the resultant sol-gel layer. This second alternative embodiment includes methods for producing an aspect of the layer 510, an aspect of the layer 720, an aspect of the layer 820, and includes inhomogeneous material of other topologies.

A third alternative embodiment comprises films grown by chemical vapor deposition, and in particular silicon nitride that is intrinsically under compressive or dilative stress. Stress is controlled by the process chemistry, temperature, and pressure. Lithographic patterning combined with an etching process produces a smoothly undulated surface.

In a fourth alternative embodiment, chemical vapor deposition or another deposition method is combined with spin-coating to form a layer comprising a plurality of films. In one aspect a colloidal sol-gel process is used with spin-coating.

The third and fourth alternative embodiments include methods for producing several aspects of the layers 610, 720, 820, and 912.

A fifth alternative embodiment includes growing a thermal oxide buffer layer of a predetermined thickness on the silicon prior to preparation of a stressed layer. The buffer layer distributes layer stresses and thereby reduces excessive stress concentrations in the optically active region of the silicon.

A sixth alternative embodiment includes growing a thin thermal oxide, patterning the oxide, and producing an array of openings exposing areas of bare silicon. The exposed silicon is then rendered hydrophilic by a hydrofluoric acid treatment. A sol-gel or other process deposits a layer on a surface comprising hydrophobic and hydrophilic areas, corresponding to regions of bare and oxidized silicon, respectively.

A seventh alternative embodiment includes forming a layer by depositing a sequence of sol-gel films in several steps. In a first aspect of forming the layer, a first film is deposited and dried. A second film is then deposited and dried. Deposition and drying steps are further repeated, completing the layer. In a second aspect, the films are annealed after drying. In a third aspect, a film is patterned prior to preparation of a subsequent film.

In an eighth alternative embodiment, a layer is formed by advantageously combining a plurality of sol-gel formulations, including formulations for preparing films with colloidal and polymer morphologies. The layer is formed by depositing a first sol-gel film using a first formulation, a second sol-gel film using a second formulation, and repeated with one or more subsequent films and formulations. Aspects of the eighth embodiment form the layers 720 and 820.

In a ninth alternative embodiment, a layer containing variations in mechanical stresses is disposed on a surface of a semiconductor, wherein the surface of the semiconductor is oriented vertically, or at a substantial angle to a substrate.

In a tenth alternative embodiment, a layer containing variations in mechanical stresses is disposed on a surface of a semiconductor comprising a plurality of free or unsupported surfaces, including semiconductor structures formed by micro-electro-mechanical-systems technology known also as MEMS.

An alternative embodiment includes a semiconductor optical emission device comprising facets on a region of optically active semiconductor or adjacent structures, thereby forming an optical cavity advantageous for stimulating coherent emission of the optical radiation.

An alternative embodiment also includes a combination of the alternative embodiments listed above.

ADVANTAGES

A variably stressed layer and an indirect band-gap semiconductor constitute a device for substantially improving the emission of optical radiation from the semiconductor. From the description above, a number of advantages of some embodiments of the semiconductor optical emission device becomes evident:

(a) The device comprising a randomly or otherwise variably stressed layer generates substantial light emission from an indirect band-gap semiconductor, wherefrom light emission is otherwise insufficient or too weak for practical applications.

(b) The method for producing the device avoids damaging the semiconductor, thereby advantageously utilizing the emission of light.

(c) The emission radiation originates from enhanced recombination of free electron carriers and free hole carriers created in the semiconductor.

(d) Fabrication of the device involves processes that are simple to implement and optimize for integration of optical devices into general microelectronics circuits or opto-electronic circuits.

(e) Devices 401 and 901 shown in FIG. 4 and FIG. 9, respectively, illustrate the ease with which articles of a layer on a semiconductor, exemplified by FIGS. 1, 5-8, are integrated to form electro-optic device structures by the addition of a process step that deposits a layer with built-in variations in stress.

(f) The sol-gel process described in the several embodiments is a low cost and manufacturable method for producing optical emission devices in large scale integration and as discrete modular components.

CONCLUSIONS, RAMIFICATIONS, AND SCOPE

Accordingly, the reader will see that the semiconductor optical emission device can be used to produce a substantial amount of radiation. A plurality of random and elastic deformations in semiconductor or silicon regions 132, 420, 532, 632, and 920 are produced by forming layers 110, 410, 510, 610, and 912, respectively. The semiconductor or silicon regions 132, 420, 532, 632, and 920 are randomly and elastically deformed without introducing plastic deformation and without creating defects. The random deformations in the silicon substantially improve emission of band-edge radiation from recombination of free electrons and holes. Random deformations increase probabilities that freely diffusing electrons and holes encounter one another and emit light. Scattering induced recombination effectively subdues the various disadvantageous non-radiative recombination processes.

A device producing optical emission comprises an article with an interface, exemplified by 120, 520, and 620, that is smooth and free of defects. Interfaces 414 and 914 of devices 401 and 901, respectively, are substantially free of defects. The method of forming the device avoids locating defects within the optically active part of the semiconductor, in particular the region 132 in the aspect of article 101; in the regions 532 and 632 of the other aspects of the article; and in the regions 420 and 920 of the devices 401 and 901, respectively. Interfaces and surfaces of vertically or horizontally emitting devices may contain facets of approximately one micrometer across for improving efficiency of emission.

The sol-gel layer 110 and the corresponding related layers in other aspects and embodiments may be a dielectric material containing silicon dioxide, nitride or other material that is optically transparent to the emission radiation. The same layer can be part of a transparent window and other optics for collecting the radiation. Devices fabricated in SOI material can utilize the buried oxide layer and include structures to collect, focus, and guide the emitted rays of light.

The expected external quantum efficiency at room temperature is at least 1% and it can be substantially higher. Devices have long expected lifetimes owing to absence of device-killing defects. In addition to having low cost and low thermal processing budget, sol-gel processes and methods have high compatibility with CMOS (complementary metal-oxide-semiconductor) fabrication methods.

A ramification of the device is to utilize bonding of thinned semiconductor film layers separated by sol-gel deposited films to form a cascaded device that yields light from several layers. Combined and collected laterally, the larger amount of light generated in this manner can be focused into an optical waveguide for transmission. Another ramification is to use silicon on glass material similar to that utilized in thin-film solar cell technology.

The scope comprises any indirect band-gap semiconductor including a silicon-germanium alloy comprising various admixtures or proportions of the constituent elements and including silicon-carbon material.

A different sol-gel process can be substituted for those described in the above embodiments, comprising differences in precursor formulation, dopants, pH, viscosity, layer thickness, layer index of refraction, anneal temperature, anneal ambient, and anneal time, and other process parameters.

An anneal in a diluted hydrogen gas ambient at a temperature near 400° C. can be included in the process to reduce the number of electronic traps at the interface between the silicon and the layer, similar to a forming gas anneal commonly employed in CMOS fabrication.

Deformations in the semiconductor include varying amounts of compression, dilation, and shear. The scope of the method includes deformations having an average compression, dilation, or shear in the semiconductor. The scope of the method also includes having no net or average compression, dilation, and shear in the semiconductor.

A device utilizing a semiconductor having a predetermined average deformation can be fabricated by combining several semiconductors with different lattice spacing. Combinations include layers comprising silicon, germanium and a silicon-germanium alloy. The average deformation in the optically active region of the device can be compressive, but it also can be dilative. A layer with variable stresses and disposed on the semiconductor superimposes modulations or variations in deformations of the semiconductor. The disposed layer can also impose an average deformation on the semiconductor.

Systems built around the described device include all-silicon transceivers. Applications include silicon transmitters adjacent to the sides of microprocessors and other integrated circuits for communicating signals through optical conduits and vias.

Device size is scalable. Applications include combining optical emission devices serving as pixels in display panels, wherein emission intensity is controlled electronically. Examples include infrared stealth display panels or displays invisible to the human eye. Large area emission devices can also be fabricated. Applications include infrared back lights and illuminators, including infrared display panels using liquid crystals and other devices for controlling pixels.

Mode of operation is flexible. Devices producing incoherent emission of radiation include a p-n diode, a p-i-n diode, and a transistor with an optically active body comprising a top gate, a back gate, or a plurality of gates. Devices producing coherent emission of radiation include a plurality of facets, refractive elements, and reflective elements adjacent to the optically active region of the semiconductor.

Although the above description of a semiconductor optical emission device contains many specificities, these should not be construed as limiting the scope of the embodiments, but as merely providing illustrations of some of several embodiments.

Many alterations and modifications may be made without departing from the scope presented herein by those having ordinary skill in the art. The claims are to be understood to include what is specifically illustrated and described above in this specification, what is conceptually equivalent, what can be substituted, and what incorporates the ideas of the specification. Thus the scope of the embodiments should be determined by the appended claims and their legal equivalents, rather than by the examples given.

What is claimed is:

1. A device providing optical emission from an indirect band-gap semiconductor comprising:
   a) the indirect band-gap semiconductor, wherein:
      the indirect band-gap semiconductor comprises a crystal, the crystal having a surface and further having a plurality of elastic deformations in a region adjacent to the surface, and the region being free from dislocations and stacking faults; and
   b) a layer formed on the surface of the crystal, wherein:
      the layer comprises a microscopically inhomogeneous material having a predetermined thickness and further having a plurality of stresses and strains,
   whereby the indirect band-gap semiconductor is responsible for the entire optical emission of the device.

2. The device of claim 1 wherein the indirect band-gap semiconductor comprises silicon, a silicon-germanium alloy, or a silicon-carbon material.

3. The device of claim 1 wherein the microscopically inhomogeneous material comprises a sol-gel film.

4. The device of claim 1, further comprising an oxide layer, wherein the oxide layer is interposed between the surface of the crystal and the layer comprising the microscopically inhomogeneous material.

5. The device of claim 3 wherein the sol-gel film comprises atomic elements selected from the group consisting of silicon, oxygen, hydrogen, and a metallic element.

* * * * *